(12) United States Patent
Chu et al.

(10) Patent No.: US 9,214,518 B1
(45) Date of Patent: Dec. 15, 2015

(54) USING MOLECULAR BEAM EPITAXY IN A SEMICONDUCTOR STRUCTURE WITH A HIGH K/GASB INTERFACE

(71) Applicants: Taiwan Semiconductor Manufacturing Company Limited, Hsinchu (TW); National Taiwan University, Taipei (TW)

(72) Inventors: Jui-Lin Chu, New Taipei (TW); Ming-Hwei Hong, Hsinchu (TW); Juei-Nai Kwo, Hsinchu (TW); Tun-Wen Pi, Hsinchu County (TW); Jen-Inn Chyi, Taoyuan County (TW)

(73) Assignee: Taiwan Semiconductor Manufacturing Company Limited and National Taiwan University (TW)

( * ) Notice: Subject to any disclaimer, the term of this patent is extended or adjusted under 35 U.S.C. 154(b) by 0 days.

(21) Appl. No.: 14/334,737

(22) Filed: Jul. 18, 2014

(51) Int. Cl.
| | | |
|---|---|---|
| *H01L 21/00* | (2006.01) | |
| *H01L 29/00* | (2006.01) | |
| *H01L 29/201* | (2006.01) | |
| *H01L 29/51* | (2006.01) | |
| *H01L 29/78* | (2006.01) | |
| *H01L 21/02* | (2006.01) | |
| *H01L 21/28* | (2006.01) | |
| *H01L 29/66* | (2006.01) | |
| *H01L 21/324* | (2006.01) | |

(52) U.S. Cl.
CPC .......... *H01L 29/201* (2013.01); *H01L 21/0228* (2013.01); *H01L 21/02057* (2013.01); *H01L 21/02178* (2013.01); *H01L 21/02192* (2013.01); *H01L 21/02266* (2013.01); *H01L 21/02398* (2013.01); *H01L 21/02549* (2013.01); *H01L 21/02631* (2013.01); *H01L 21/28264* (2013.01); *H01L 21/324* (2013.01); *H01L 29/517* (2013.01); *H01L 29/66522* (2013.01); *H01L 29/78* (2013.01)

(58) Field of Classification Search
CPC ................... H01L 27/14687; H01L 27/14689; H01L 27/14643; H01L 21/02549; H01L 21/02466; H01L 21/02398; H01L 21/02057; H01L 21/02631; H01L 21/02178; H01L 21/02266; H01L 21/02192; H01L 21/28264; H01L 21/324; H01L 21/0228; H01L 29/201; H01L 29/66522; H01L 29/517; H01L 29/78
See application file for complete search history.

(56) References Cited

U.S. PATENT DOCUMENTS

| | | | | |
|---|---|---|---|---|
| 5,420,442 | A * | 5/1995 | Hasenberg et al. | 257/22 |
| 5,741,360 | A * | 4/1998 | Goto et al. | 117/94 |
| 7,531,404 | B2 * | 5/2009 | Pae et al. | 438/211 |
| 8,012,817 | B2 * | 9/2011 | Masuoka et al. | 438/197 |
| 2007/0045753 | A1 * | 3/2007 | Pae et al. | 257/410 |
| 2010/0078733 | A1 * | 4/2010 | Masuoka et al. | 257/384 |

* cited by examiner

*Primary Examiner* — Nikolay Yushin
(74) *Attorney, Agent, or Firm* — Jones Day

(57) ABSTRACT

Disclosed is a wafer comprising a first layer of GaSb grown on a GaSb substrate by molecular beam epitaxy (MBE), an oxide layer deposited on the surface of the first layer, and a cap layer deposited on the surface of the oxide layer. The wafer was capped with an arsenic (As) layer after the growth of the first layer. The As layer was removed from the wafer before the oxide layer was deposited on the surface of the first layer. Also disclosed is a method of forming a wafer. The method comprises growing a first layer of GaSb on a GaSb substrate by MBE, capping the wafer with an As layer after the growth of the first layer, removing the As layer from the wafer, depositing an oxide layer on the surface of the first layer, and depositing a cap layer on the surface of the oxide layer.

8 Claims, 2 Drawing Sheets

USING MOLECULAR BEAM EPITAXY IN A SEMICONDUCTOR STRUCTURE WITH A HIGH K/GASB INTERFACE

BACKGROUND

The technology described in this patent document relates to GaSb substrates, and more specifically to forming structures with a high-K dielectric on a GaSb substrate.

Scaling of semiconductor devices, such as a MOSFET, has enabled continued improvement in speed, performance, density, and cost per unit function of integrated circuits over the past few decades. Improvements to the processes used in fabricating semiconductor structures can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
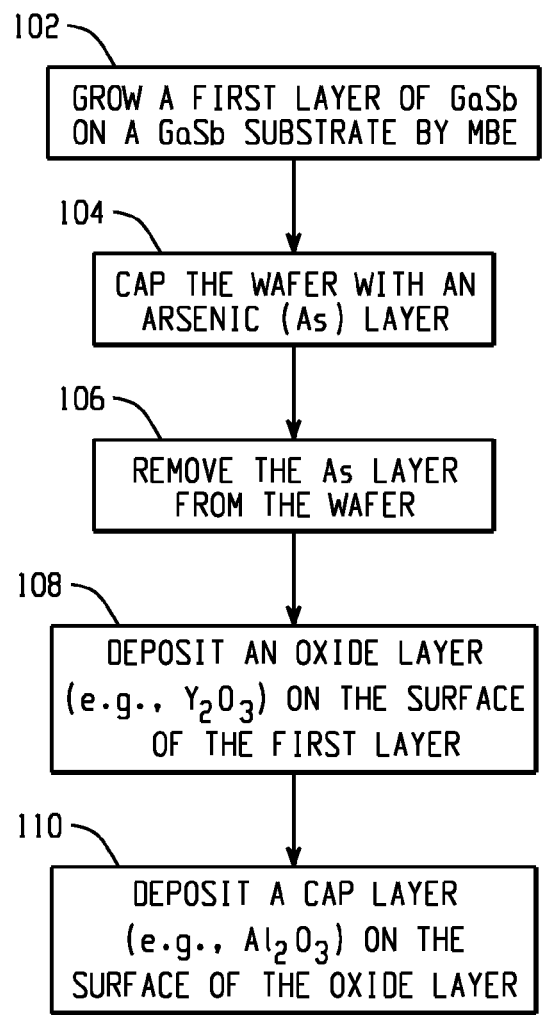
FIG. 1 depicts an example process flow chart for creating a wafer that may be used in a semiconductor fabrication process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Antimonide-based (Sb-based) compound semiconductors, such as GaSb and InSb, are materials that may be used in substrates for high-speed low-power electronics, mid-infrared sensors/detectors, and solar cells due to their wide range of tunable band gaps and high carrier mobility. The surfaces of GaSb (and InSb) can be highly reactive and may form native oxides of GaOx and SbOx after air exposure. SbOx, however, can be thermally unstable and may react with the substrate to form $Ga_2O_3$ and elemental Sb as end-products. Elemental Sb can cause leakage and Fermi level pinning (high gap states) in semiconductor devices made from Antimonide-based (Sb-based) substrates. When GaOx and/or SbOx are found at an oxide/GaSb interface, satisfactory interfacial properties and thermal stability may not be achieved.

Disclosed herein are methods and structures that employ molecular beam epitaxial growth of $Y_2O_3$ (MBE-$Y_2O_3$) to attain a SbOx-free, elemental Sb-free, and well-bonded high-K/GaSb interface, which may be thermally stable up to 500° C.

FIG. 1 depicts an example process flow chart for creating a wafer that may be used in a semiconductor fabrication process. A first layer of GaSb is grown on a GaSb substrate by molecular beam epitaxy (MBE) (operation 102).

The wafer in then capped with an arsenic (As) layer after the growth of the first layer (operation 104) to protect the GaSb surface during wafer transferring. The As capping can be effective in preventing the GaSb surface from oxidation and contamination during wafer transferring. The As capping, in this example, is effective in preventing the GaSb surface from being contaminated with GaOx, SbOx, or elemental Sb during wafer transferring.

After transferring the wafer, the As layer may be removed from the surface of the wafer and the surface of the wafer is reconstructed (operation 106). This may provide a clean and atomically ordered GaSb surface prior to gate dielectrics deposition After As decapping and surface reconstruction, an oxide layer is deposited on the surface of the first layer (operation 108). The oxide layer, in this example, is formed from a high-k gate dielectric material that comprises $Y_2O_3$ and does not comprise SbOx or elemental Sb. The oxide layer in other examples could comprise other rare earth oxides.

A cap layer is deposited on the surface of the oxide layer to reduce the likelihood of the oxide layer absorbing moisture upon air exposure (operation 110). In this example, the cap layer comprises $Al_2O_3$.

Figure 2:
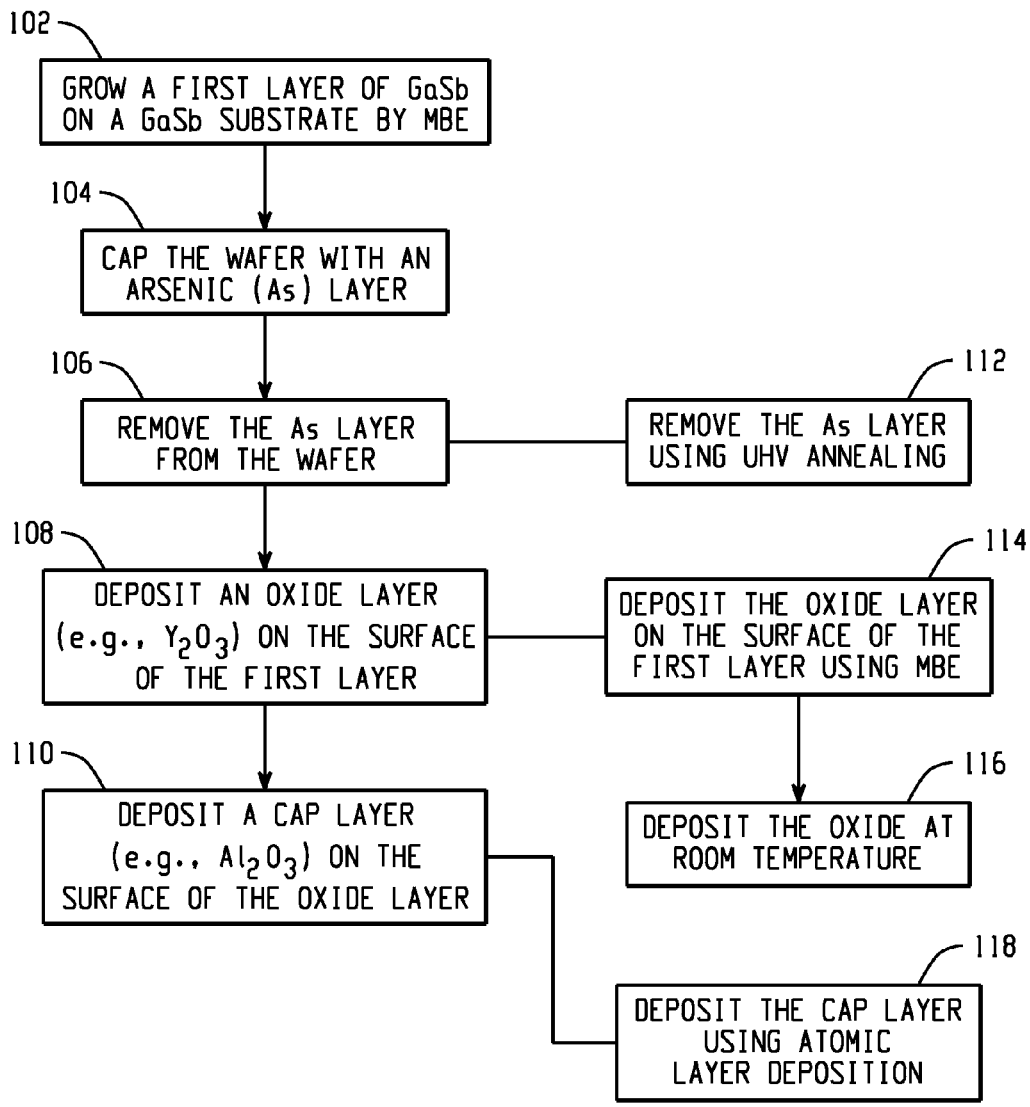
FIG. 2 depicts another example process flow chart for creating a wafer that may be used in a semiconductor fabrication process.

FIG. 2 depicts another example process flow chart for creating a wafer that may be used in a semiconductor fabrication process. The process flow chart of FIG. 2 is similar to that of FIG. 1 and describes some additional steps for creating a wafer. A first layer of GaSb is grown on a GaSb substrate by molecular beam epitaxy (MBE) (operation 102).

The wafer in then capped with an arsenic (As) layer after the growth of the first layer (operation 104) to protect the GaSb surface during wafer transferring. The As capping can be effective in preventing the GaSb surface from oxidation and contamination during wafer transferring. The As capping, in this example, is effective in preventing the GaSb surface from being contaminated with GaOx, SbOx, or elemental Sb during wafer transferring.

After transferring the wafer, the As layer may be removed from the surface of the wafer and the surface of the wafer is reconstructed (operation 106). The As removal (i.e., decapping) and surface reconstruction may be performed by UHV annealing operations (operation 112). This may provide a clean and atomically ordered GaSb surface prior to gate dielectrics deposition After As decapping and surface reconstruction, an oxide layer is deposited on the surface of the first layer (operation 108). The oxide layer, in this example, is formed from a high-k gate dielectric material that comprises $Y_2O_3$ and does not comprise SbOx or elemental Sb. The $Y_2O_3$ in this example is deposited using MBE operations (operation 114). The MBE in this example allows $Y_2O_3$ to be deposited at room temperature (operation 116) which can reduce the thermal budget. Alternatively, the oxide layer could have been deposited on the surface of the first layer by atomic layer deposition (ALD) or some other technique. In other examples, the oxide layer could have been deposited on the first layer in a range of temperatures between room temperature and 300-400° C.

A cap layer is deposited on the surface of the oxide layer to reduce the likelihood of the oxide layer absorbing moisture upon air exposure (operation 110). In this example, the cap layer comprises $Al_2O_3$. In other examples, the cap layer may comprise other dielectrics having a higher dielectric constant. Also in this example, the cap layer was deposited on the surface of the oxide layer using atomic layer deposition (ALD) (operation 118).

Figure 3:
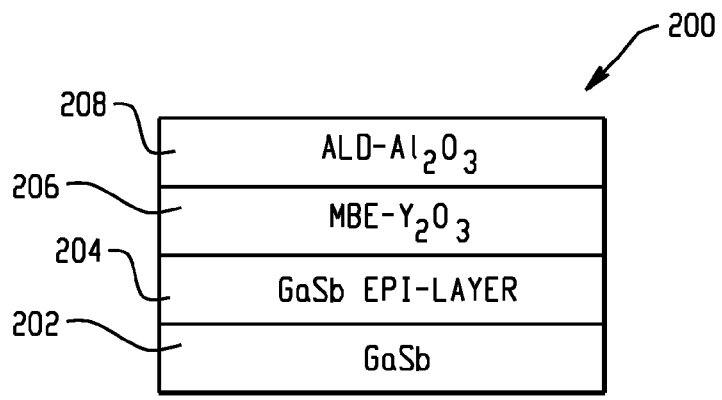
FIG. 3 depicts a cross sectional view of an example wafer that may be used in a semiconductor fabrication process.

FIG. 3 depicts a cross sectional view of an example wafer 200 that may be used in a semiconductor fabrication process. A first layer of GaSb 204 is grown on a GaSb substrate 202 by molecular beam epitaxy (MBE) (operation 102).

The wafer 200 in then capped with an arsenic (As) layer after the growth of the first layer (operation 104) to protect the GaSb surface 204 during wafer transferring. The As capping can be effective in preventing the GaSb surface from oxidation and contamination during wafer transferring. The As capping, in this example, is effective in preventing the GaSb surface from being contaminated with GaOx, SbOx, or elemental Sb during wafer transferring.

After transferring the wafer, the As layer may be removed from the surface of the GaSb epi-layer 204 and the surface is reconstructed. This may provide a clean and atomically ordered GaSb surface prior to gate dielectrics deposition After As decapping and surface reconstruction, an oxide layer 206 is deposited on the surface of the first layer 204. The oxide layer 206, in this example, is formed from a high-k gate dielectric material that comprises $Y_2O_3$ and does not comprise SbOx or elemental Sb. The $Y_2O_3$ in this example was deposited using MBE operations. The MBE in this example allowed $Y_2O_3$ to be deposited at room temperature which can reduce the thermal budget. Alternatively, the oxide layer could have been deposited on the surface of the first layer by atomic layer deposition (ALD) or some other technique. In other examples, the oxide layer could have been deposited on the first layer in a range of temperatures between room temperature and 300-400° C.

A cap layer 208 is deposited on the surface of the oxide layer 206 to reduce the likelihood of the oxide layer 206 absorbing moisture upon air exposure. In this example, the cap layer 208 comprises $Al_2O_3$. In other examples, the cap layer may comprise other dielectrics having a higher dielectric constant. Also in this example, the cap layer was deposited on the surface of the oxide layer using atomic layer deposition (ALD).

The $D_{it}$ values of the example semiconductor structure 200 toward the valence band edge are much lower than that of conduction band edge. Thus, the example semiconductor structure 200 may be useful for fabricating a p-channel metal oxide semiconductor (PMOS) device.

The methods and structures disclosed herein may result in the attainment of a semiconductor structure that is thermally stable up to 500° C. for an $Y_2O_3$/GaSb interface because of the absence of SbOx.

In one embodiment, disclosed is a wafer for use in a semiconductor fabrication process. The wafer comprises a first layer of GaSb grown on a GaSb substrate by molecular beam epitaxy (MBE), an oxide layer deposited on the surface of the first layer wherein the oxide layer does not include SbOx or elemental Sb, and a cap layer deposited on the surface of the oxide layer to reduce the likelihood of the oxide layer absorbing moisture upon air exposure. The wafer was capped with an arsenic (As) layer after the growth of the first layer. The As layer was removed from the wafer before the oxide layer was deposited on the surface of the first layer.

These aspects and other embodiments may include one or more of the following features. The oxide layer may comprise $Y_2O_3$ or other rare earth oxide. The As was removed from the wafer using UHV annealing. The oxide layer was deposited on the surface of the first layer by MBE or atomic layer deposition (ALD). The oxide layer was deposited on the surface of the first layer at room temperature or a range of temperatures from room temperature to 300-400° C. The cap layer may comprise $Al_2O_3$ or another dielectric with a higher dielectric constant. The cap layer was deposited on the surface of the oxide layer using atomic layer deposition. The As capping may be effective in preventing the GaSb surface from being contaminated with GaOx, SbOx, or elemental Sb during wafer transferring. The wafer may comprise a clean and atomically ordered GaSb surface prior to gate dielectrics deposition.

In another embodiment, a method of forming a wafer for use in a semiconductor fabrication process is disclosed. The method comprises growing a first layer of GaSb on a GaSb substrate by molecular beam epitaxy (MBE), capping the wafer with an arsenic (As) layer after the growth of the first layer, and removing the As layer from the wafer before depositing an oxide layer on the surface of the first layer. The method further comprises depositing an oxide layer on the surface of the first layer wherein the oxide layer does not comprise SbOx or elemental Sb and depositing a cap layer on the surface of the oxide layer to reduce the likelihood of the oxide layer absorbing moisture upon air exposure.

These aspects and other embodiments may include one or more of the following features. The oxide layer may comprise $Y_2O_3$ or other rare earth oxide. The removing the As layer from the wafer may be performed using UHV annealing. The depositing an oxide layer on the surface of the first layer may be performed using MBE or atomic layer deposition (ALD). The depositing an oxide layer on the surface of the first layer may be performed at room temperature or a range of temperatures from room temperature to 300-400° C. The cap layer may comprise $Al_2O_3$ or another dielectric with a higher dielectric constant. The depositing a cap layer on the surface of the oxide layer may be performed using atomic layer deposition. The capping the wafer with an arsenic (As) layer after the growth of the first layer may be effective in preventing the GaSb surface from being contaminated with GaOx, SbOx, or elemental Sb during wafer transferring.

In yet another embodiment, a semiconductor structure is disclosed. The semiconductor structure comprises a first layer of GaSb grown on a GaSb substrate by molecular beam epitaxy (MBE) and a high-k gate dielectric material forming an oxide layer deposited on the surface of the first layer by MBE. The oxide layer does not include SbOx or elemental Sb. The oxide layer was deposited at room temperature after an arsenic (As) layer was formed over and later removed from the first layer using UHV annealing.

These aspects and other embodiments may include one or more of the following features. The oxide layer may comprise $Y_2O_3$ or other rare earth oxide. The semiconductor structure may comprise a p-channel metal oxide semiconductor (PMOS) device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a wafer for use in a semiconductor fabrication process, the method comprising:
    growing a first layer of GaSb on a GaSb substrate by molecular beam epitaxy (MBE);
    capping the wafer with an arsenic (As) layer after the growth of the first layer of GaSb;
    removing the As layer from the wafer before depositing an oxide layer on the surface of the first layer of GaSb;
    depositing an oxide layer on the surface of the first layer of GaSb, wherein the oxide layer does not comprise SbOx or elemental Sb; and
    depositing a cap layer on the surface of the oxide layer to reduce the likelihood of the oxide layer absorbing moisture upon air exposure.

2. The method of claim 1, wherein the oxide layer comprises $Y_2O_3$ or other rare earth oxide.

3. The method of claim 1, wherein the removing the As layer from the wafer was performed using UHV annealing.

4. The method of claim 1, wherein the depositing an oxide layer on the surface of the first layer of GaSb was performed using MBE or atomic layer deposition (ALD).

5. The method of claim 4, wherein the depositing an oxide layer on the surface of the first layer of GaSb was performed at room temperature or a range of temperatures from room temperature to 300-400° C.

6. The method of claim 1, wherein the cap layer comprises $Al_2O_3$ or another dielectric with a higher dielectric constant.

7. The method of claim 1, wherein the depositing a cap layer on the surface of the oxide layer was performed using atomic layer deposition.

8. The method of claim 1, wherein the capping the wafer with an arsenic (As) layer after the growth of the first layer of GaSb is effective in preventing the GaSb surface from being contaminated with GaOx, SbOx, or elemental Sb during wafer transferring.

* * * * *